(12) United States Patent
Akiyama et al.

(10) Patent No.: US 8,741,786 B2
(45) Date of Patent: Jun. 3, 2014

(54) FABRICATION METHOD OF SEMICONDUCTOR DEVICE

(75) Inventors: Koji Akiyama, Yamanashi (JP);
Hirokazu Higashijima, Yamanashi (JP);
Yoshitsugu Tanaka, Yamanashi (JP);
Yasushi Akasaka, Hsin-chu (TW); Koji Yamashita, Billerica, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/473,817

(22) Filed: May 17, 2012

(65) Prior Publication Data

US 2012/0309207 A1 Dec. 6, 2012

(30) Foreign Application Priority Data

May 30, 2011 (JP) ................... 2011-120851

(51) Int. Cl.
*H01L 21/31* (2006.01)
(52) U.S. Cl.
USPC ........................................ 438/778; 438/785
(58) Field of Classification Search
USPC ................................................. 438/778, 785
See application file for complete search history.

(56) References Cited

U.S. PATENT DOCUMENTS

2008/0017936 A1* 1/2008 Buchanan et al. ............ 257/411
2010/0178744 A1* 7/2010 Takahashi et al. ............ 438/287

FOREIGN PATENT DOCUMENTS

| JP | 03-067346 | 10/1991 |
| JP | 2010-070788 | 4/2010 |
| WO | WO 2010117551 A1 * | 10/2010 |

OTHER PUBLICATIONS

Isao Yamada et al., "Cluster ion beam process technology", Nuclear Instruments and Methods in Physics Research B 206 (2003) 820-829.

* cited by examiner

*Primary Examiner* — Kyoung Lee
*Assistant Examiner* — Ratisha Mehta
(74) *Attorney, Agent, or Firm* — IPUSA, PLLC

(57) ABSTRACT

A disclosed fabrication method of a semiconductor device includes steps of depositing a dielectric film on a semiconductor substrate; thermally treating the dielectric film; and irradiating an ionized gas cluster onto the thermally treated dielectric film.

10 Claims, 4 Drawing Sheets

FABRICATION METHOD OF SEMICONDUCTOR DEVICE

CROSS-REFERENCE TO RELATED APPLICATION

The present application is based on Japanese Patent Application No. 2011-120851 filed with the Japanese Patent Office on May 30, 2011, the entire contents of which are hereby incorporated herein by reference.

BACKGROUND OF THE INVENTION

1. Field of the Invention

The present invention relates to a fabrication method of a semiconductor device.

2. Description of the Related Art

A silicon oxide film has been used as a gate insulating film or the like in field effect transistors in a semiconductor integrated circuit (IC). Silicon oxide is an extremely excellent material for an insulating film because silicon oxide has a relatively high endurance voltage and a relatively low leakage current level. On the other hand, the silicon oxide film has a relatively low dielectric constant, which may be disadvantageous for recent further miniaturization and higher integration of ICs.

Along with a recent demand for higher integration of ICs, use of a high-k film having a higher dielectric constant than the silicon oxide film has been considered as the gate insulating film or the like.

Such a high-k film may be formed by a Chemical Vapor Deposition (CVD) method or an Atomic Layer Deposition (ALD) method, and then a thermal treatment is carried out with respect to the deposited high-k film in order to reduce residual impurities therein.

However, the thermal treatment may have a problem that the high-k film becomes poly-crystalline, which leads to increased leakage current.

Patent Document 1: Examined Patent Publication No. H03-067346

SUMMARY OF THE INVENTION

In order to suppress poly-crystallization during such a thermal treatment and thus reduce the leakage current in the high-k film, there has been proposed a method where materials such as silicon oxide or aluminum oxide are doped to the high-k film.

However, such materials have a relatively lower dielectric constant and may reduce the dielectric constant of the high-k film when doped, even if the materials can suppress poly-crystallization of the high-k film. When the dielectric constant of the high-k film is reduced, the reason for the use of the high-k film in the transistor is disregarded.

Therefore, a method of forming a dielectric film and a fabrication method of a semiconductor device that employs the dielectric film have been demanded which are capable of reducing a leakage current while maintaining a high dielectric constant of the high-k film.

An aspect of the present invention provides a fabrication method of a semiconductor device. The fabrication method includes steps of depositing a dielectric film on a semiconductor substrate; thermally treating the dielectric film; and irradiating an ionized gas cluster onto the thermally treated dielectric film.

DETAILED DESCRIPTION OF THE PREFERRED EMBODIMENT

Figure 1:
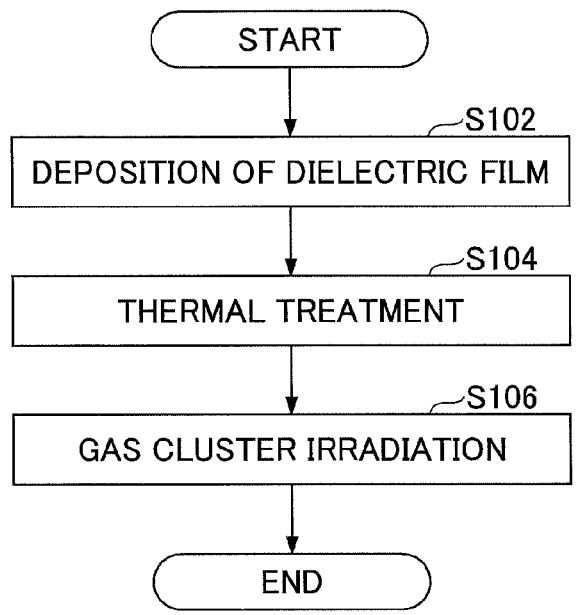
FIG. 1 is a flowchart of a method of forming a dielectric film according to an embodiment of the present invention.

According to an embodiment of the present invention, there are provided a method of forming a high-k film and a fabrication method of a semiconductor device, which are capable of forming a dielectric film yielding a low leakage current while maintaining a dielectric constant, thereby providing a semiconductor device at high yield.

Non-limiting, exemplary embodiments of the present invention will now be described with reference to the accompanying drawings. In the drawings, the same or corresponding reference symbols are given to the same or corresponding members or components.

(A Method of Forming a Dielectric Film)

Referring to FIG. 1, a method of forming a dielectric film, specifically, a high-k film is explained.

First, a dielectric film is deposited on a substrate such as a silicon wafer, at Step S102. The dielectric film is made of, for example, rare-earth metal oxide such as hafnium oxide ($HfO_2$), zirconium oxide ($ZrO_2$), aluminum oxide ($Al_2O_3$), tantalum pentoxide ($Ta_2O_5$), titanium oxide ($TiO_2$), and yttrium oxide ($Y_2O_3$); and alloys of such rare-earth metal oxides; silicon-doped rare-earth metal oxides and alloys of the above; and the rare-earth metal oxides and alloys of the above that go through nitridation treatment. In addition, a CVD method, an ALD method, or the like may be used in order to deposit the dielectric film.

Next, a thermal treatment is carried out with respect to the dielectric film at Step S104 in order to reduce or discharge residual impurities in the dielectric film. A temperature at this thermal treatment may be about 850° C., by which the dielectric film may become poly-crystalline. When the dielectric film becomes poly-crystalline, a leakage current is thought to be increased. Namely, grain boundaries in the poly-crystalline film provide leakage current paths, which increases the leakage current in the poly-crystalline dielectric film. In other words, the thermal treatment may cause the leakage current to be increased.

Next, ionized gas clusters are irradiated onto the dielectric film at Step S106. The ionized gas clusters are composed of several hundred through several thousand atoms. The atoms that constitute the gas clusters may be, for example, oxygen atoms, nitrogen atoms, or the like.

Next, a gas cluster irradiating apparatus that is used to irradiate the ionized gas clusters onto the dielectric film is explained.

Figure 2:
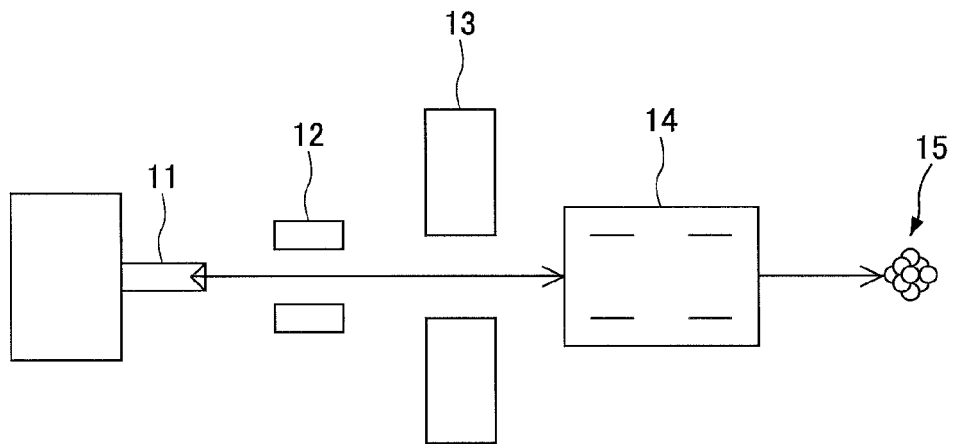
FIG. 2 is a schematic diagram of a gas cluster irradiating apparatus to be used in the embodiment.

FIG. 2 illustrates a gas cluster irradiating apparatus used in this embodiment. The gas cluster irradiating apparatus is provided with a nozzle part 11 that generates the gas clusters, ionization electrodes 12, acceleration electrodes 13, and a gas cluster separating part 14.

In the nozzle part 11, gas clusters are generated from pressurized gas. Specifically, gas supplied at a high pressure to the nozzle part 11 is jetted out from the nozzle part 11, and thus the gas clusters are generated. The gas used in this embodiment is a substance in gas phase at normal temperatures, and is preferably oxygen gas, or the like.

The generated gas clusters are ionized by the ionization electrodes 12, and thus ionized gas clusters are generated.

Next, the ionized gas clusters are accelerated by the acceleration electrodes 13. At this time, the ionized gas clusters are accelerated inversely proportional to a square root of the number of the atoms constituting the gas clusters or a square root of a mass of the gas clusters. In addition, the gas clusters are accelerated proportional to a square root of the valence number of the ionization.

Next, the gas clusters are separated depending on the valence number of the gas clusters by the gas cluster separating part 14. Specifically, the cluster separating part 14 removes monomer ions or the like that do not constitute the gas clusters by applying an electric field or a magnetic field.

Then, the ionized gas clusters 15 are irradiated onto the dielectric film.

(Properties of the Dielectric Film)

Next, properties of the dielectric film obtained according to this embodiment are explained. The dielectric film here is made of aluminum oxide, and has been deposited by the CVD method. In the following explanation, Sample A is as deposited film. Namely, the aluminum oxide film of Sample A does not go through the thermal treatment. The aluminum oxide film of Sample B has been thermally treated but does not go through the ionized gas cluster irradiation; and the aluminum oxide film of Sample C has gone through the thermal treatment and the ionized gas cluster irradiation. Namely, the aluminum oxide of Sample C has been prepared according to this embodiment.

Figure 3:
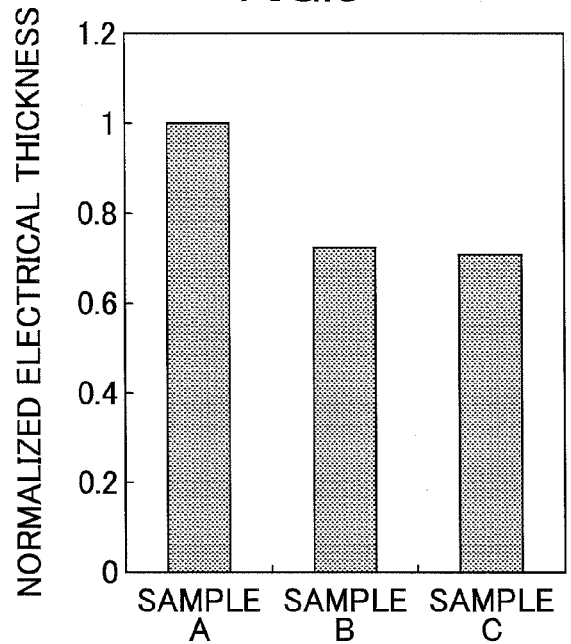
FIG. 3 is a graph illustrating a normalized equivalent oxide thickness (EOT) of the dielectric film.

FIG. 3 illustrates an equivalent oxide thickness (EOT) normalized by a thickness of the aluminum oxide film of Sample A. As seen from FIG. 3, the dielectric constants in Samples B and C, which have gone through the thermal treatment, are greater than that in Sample A, which has not gone through the thermal treatment, and Samples B and C have a smaller EOT than Sample A. Therefore, the dielectric constant can be increased by the thermal treatment. Incidentally, Samples B and C have substantially the same EOT, which may indicate that the ionized gas cluster irradiation does not affect the EOT.

Figure 4:
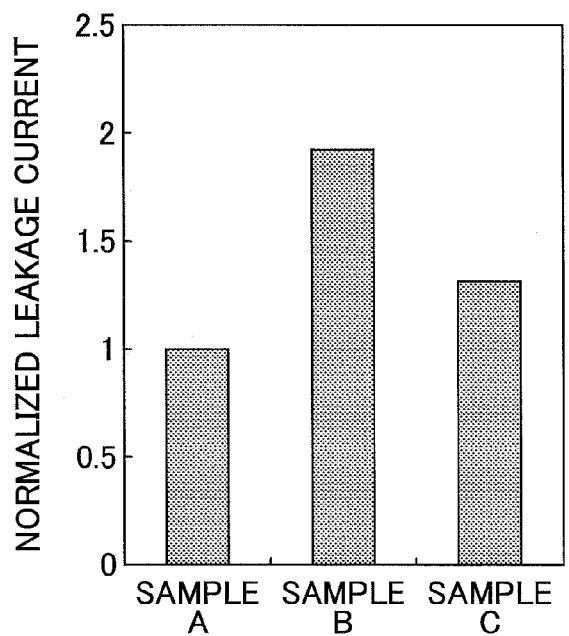
FIG. 4 is a graph illustrating a leakage current of the dielectric film.

FIG. 4 is a graph that illustrates a leakage current normalized by the leakage current measured in Sample A. By comparing the leakage currents of Samples A, B, and C, it becomes apparent that the leakage current is increased when carrying out the thermal treatment (Samples B and C). This is thought to be because the dielectric film becomes poly-crystalline due to the thermal treatment and thus a relatively large amount of electric current can flow through the grain boundaries. On the other hand, the leakage current in Sample C that has gone through the thermal treatment and the ionized gas cluster irradiation is smaller than that in Sample B. This is thought to be because an upper surface of the dielectric film is altered by the ionized gas cluster irradiation. The ionized gas clusters can affect the upper surface of the dielectric film, and thus when the ionized gas clusters are irradiated onto the dielectric film only the upper part of the dielectric film may be altered. Specifically, it is thought that the upper part of the dielectric film becomes, for example, amorphous.

Figure 5:
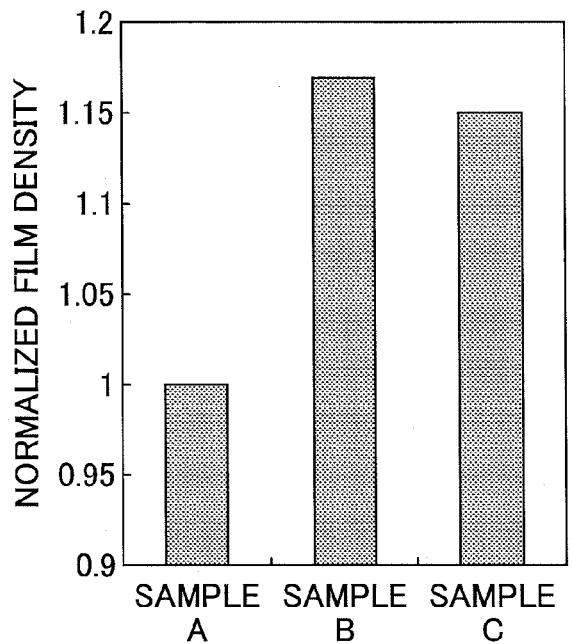
FIG. 5 is a graph illustrating a film density of the dielectric film.

FIG. 5 is a graph that illustrates a film density normalized by Sample A. By comparing the film densities of Sample A and Sample B, the film density is increased by carrying out the thermal treatment. This is thought to be because the dielectric film becomes poly-crystalline and thus the film density is increased. In addition, because the film densities of Sample B and Sample C are substantially the same, the ionized gas cluster is shown not to have a large impact on the dielectric films.

Figure 6:
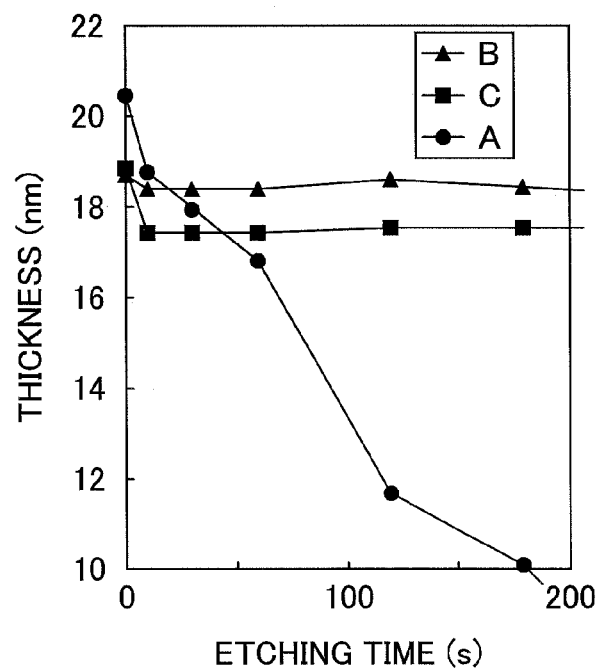
FIG. 6 is a graph illustrating a diluted hydrogen fluoride etching characteristic of the dielectric film.

FIG. 6 is a graph that illustrates a relationship between an etching time and a remaining thickness of a dielectric film etched by diluted hydrogen fluoride (DHF). Because Sample A is not poly-crystalline, an etching rate of Sample A is higher. On the other hand, Sample B is not substantially etched because Sample B is made poly-crystalline by the thermal treatment. In addition, Sample C is etched by the DHF by only a thickness of 1 to 2 nm, and the etching does not proceed further.

From the foregoing, it is thought that an upper layer part, which is about 1 to 2 nm from the upper surface, of the dielectric film obtained according to the embodiment, namely Sample C is altered, so that properties of the upper layer part are different from those of a bulk part (below the upper layer part) of the dielectric film. At least for the above reason, the dielectric film having a relatively high dielectric constant and a relatively low leakage current can be obtained.

Incidentally, a depth of the upper layer part that can be altered may be adjusted by conditions of the ionized gas cluster irradiation.

In addition, substantially the same properties as explained above about the $Al_2O_3$ are obtained in other materials including the rare-earth oxide films such as $HfO_2$, $ZrO_2$, $Ta_2O_5$, $TiO_2$, and $Y_2O_3$.

In addition, while the oxygen ionized gas clusters are used in this embodiment, it is thought that substantially the same results are obtained when nitrogen ionized gas clusters are used. However, when argon ionized gas clusters are used, it is observed that the leakage current is rather increased. Therefore, a source gas from which the ionized gas clusters are generated may preferably be oxygen and nitrogen.

In addition, when monomer ions, which are obtained by ionizing atoms, are irradiated onto the dielectric film, the monomer ions may pass through the entire dielectric film, and thus reach and affect the substrate. Therefore, it is difficult to affect only the upper layer part of the dielectric film. On the other hand, when the ionized gas clusters are irradiated onto the dielectric film, the upper layer part of 1 to 2 nm of the dielectric film can be altered because of extremely low energy effect of the ionized gas clusters. In other words, it is the ionized gas clusters that can alter the upper layer part of the dielectric film. In order to obtain such an effect, the number of the atoms that constitute the ionized gas clusters is preferably a thousand or more.

Incidentally, as a similar method that can introduce a chemical element into a film, an ion implantation method has been known. However, it is very difficult to alter a relatively thin high-k film by the ion implantation where atoms or molecules are ionized and then the ionized atoms or molecules are introduced into the film, because the ionized atoms or molecules can easily pass through the high-k film to reach the substrate, and thus affect the substrate.

In order to alter the high-k film, the ions need to be implanted into the high-k film at an atom density of $1 \times 10^{21}$ to $1 \times 10^{22}$ $cm^{-3}$. However, when the number of oxygen atoms implanted into, for example, a silicon wafer on which the dielectric film is deposited exceeds a level of $1 \times 10^{18}$ $cm^{-3}$, a problem is caused that the silicon wafer is oxidized. Namely, in the case of the ion implantation, it is very difficult to alter the dielectric film without adversely affecting the substrate. In addition, when ions are implanted into a crystalline film, there is caused a so-called channeling effect where a certain number of the ions are scattered relative to a particular crystalline direction. Because of the channeling effect, the ions are likely to proceed deep into the dielectric film.

On the other hand, because the ionized gas clusters are introduced into a film in accordance with a principle different from that in the ion implantation, the ionized gas clusters can alter the dielectric film without adversely affecting the substrate. When the gas clusters composed of several thousand atoms are irradiated onto an object, a high temperature and high pressure area is instantaneously caused in the vicinity of the irradiated point of the object, so that the area is melted and the atoms permeate the melted area. A depth of the permeation is determined by a depth of the melted area, and thus can be controlled to be shallow. In other words, a steep profile of the introduced atoms by the ionized gas cluster irradiation can be obtained. In addition, when the ionized gas clusters are irradiated onto an upper surface of an object, a multi-body collision is caused in the vicinity of the upper surface irradiated by the ionized gas clusters. Therefore, no channeling effect is caused in the case of the ionized gas cluster irradiation. Moreover, the melting explained above also impedes the channeling effect. The average number of the atoms that constitute the ionized gas cluster may be several thousands, and thus energy per atom can be relatively quite low. See "Basic and application of cluster ion beam", written and edited by K. Yamada, pp. 145-147, Nikkan Kogyou Newspaper, ISBN 4-526-05765-7.

(Fabrication Method of Semiconductor Device)

Next, a fabrication method of a semiconductor device according to an embodiment of the present invention is explained with reference to FIG. 7.

Figure 7:
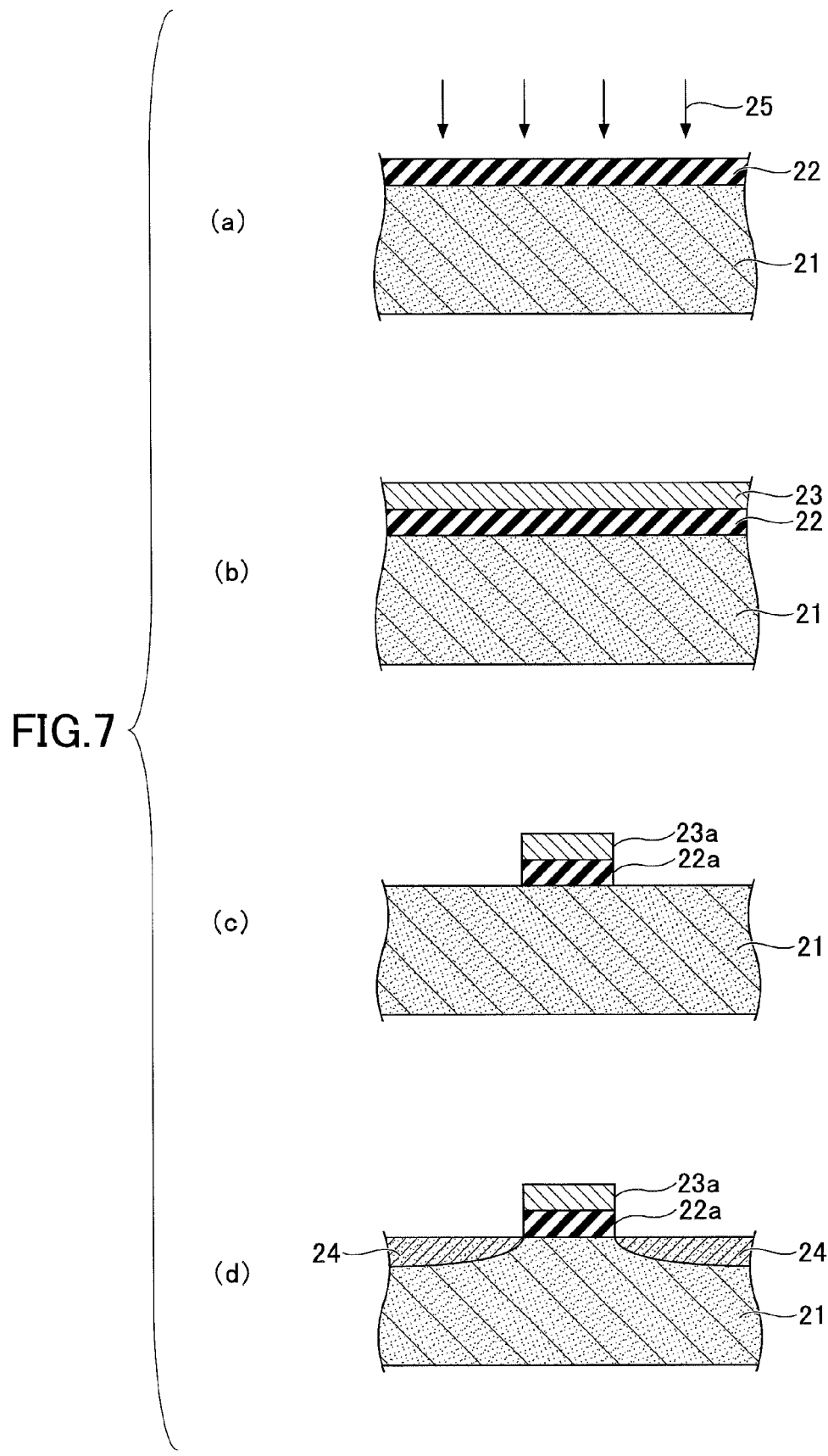
FIG. 7 is an explanatory view for explaining a fabrication method of a semiconductor device according to an embodiment of the present invention.

First, a $HfO_2$ film serving as the dielectric film is deposited on a silicon substrate 21 by a CVD method as shown in Section (a) of FIG. 7. The thermal treatment explained above is carried out with respect to the $HfO_2$ film, and then the ionized gas clusters 25 explained above are irradiated onto the $HfO_2$ film.

Next, an electrode film 23 made of, for example, poly silicon is formed on the $HfO_2$ film 22 as shown in Section (b) of FIG. 7.

Then, the $HfO_2$ film and the electrode film 23 that exist in an area except for a gate area where a gate electrode and a gate insulating film are formed are etched off, as shown in Section (c) of FIG. 7. With this etching, a gate insulating film 22a is formed from the remaining $HfO_2$ film; and a gate electrode 23a is formed from the remaining electrode film 23.

Next, impurities are implanted into the upper surface of the silicon substrate 21 except for the gate area by an ion implantation method, thereby forming high concentration areas 24 containing a relatively high impurity concentration, as shown in Section (d) of FIG. 7. Subsequently, a drain electrode and a source electrode (not shown) are formed on the corresponding high concentration areas 24. With these procedures, a field effect transistor (FET) is completed.

According to the fabrication method of the semiconductor device of this embodiment, the FET having a relatively high dielectric constant and a relatively low leakage current can be fabricated. In addition, according to the fabrication method of the semiconductor device of this embodiment, an IC having plural of the FETs highly integrated can be fabricated.

Incidentally, while the fabrication method of the semiconductor device is explained taking an example of the FET in this embodiment, the fabrication method can be applied when forming other electric devices such as a capacitor in other embodiments.

Although the present invention has been explained referring to the foregoing embodiments, the present invention is not limited to the disclosed embodiments, but may be modified or altered within the scope of the accompanying claims.

What is claimed is:

1. A fabrication method of a semiconductor device, comprising steps of:
   depositing a dielectric film on a semiconductor substrate;
   thermally treating the dielectric film;
   generating a gas cluster;
   ionizing the gas cluster; and
   irradiating the gas cluster which is ionized onto only an upper surface of the thermally treated dielectric film.

2. The fabrication method of a semiconductor device according to claim 1, wherein the irradiating the ionized gas cluster step alters the surface of the dielectric film at 2 nm or less in depth from the surface of the dielectric film.

3. The fabrication method of a semiconductor device according to claim 2, wherein the dielectric film comprises one or more selected from a group of $HfO_2$, $ZrO_2$, $Al_2O_3$, $Ta_2O_5$, $TiO_2$, and $Y_2O_3$.

4. The fabrication method of a semiconductor device according to claim 2, wherein the ionized gas cluster is one of an oxygen ionized gas cluster and a nitrogen ionized gas cluster.

5. The fabrication method of a semiconductor device according to claim 4, wherein the average number of atoms that constitute the ionized gas cluster is more than one thousand.

6. The fabrication method of a semiconductor device according to claim 5, wherein the dielectric film is deposited by one of a chemical vapor deposition method and an atomic layer deposition method.

7. The fabrication method of a semiconductor device according to claim 1, wherein the thermally treating step alters the dielectric film, and the irradiating the ionized gas cluster step further alters the surface of the dielectric film.

8. The fabrication method of a semiconductor device according to claim 7, wherein the thermally treating step alters the dielectric film so that the dielectric film becomes poly-crystalline.

9. The fabrication method of a semiconductor device according to claim 1, wherein the irradiating reduces a leakage current which flows through the dielectric film.

10. The fabrication method of a semiconductor device according to claim 1, wherein the irradiating is performed after the thermally treating the dielectric film.

* * * * *